United States Patent [19]
Mohondro

[11] Patent Number: 6,057,084
[45] Date of Patent: May 2, 2000

[54] CONTROLLED AMINE POISONING FOR REDUCED SHRINKAGE OF FEATURES FORMED IN PHOTORESIST

[75] Inventor: Robert Douglas Mohondro, Sykesville, Md.

[73] Assignee: Fusion Systems Corporation, Rockville, Md.

[21] Appl. No.: 08/943,623

[22] Filed: Oct. 3, 1997

[51] Int. Cl.[7] .................................................. G03F 7/00
[52] U.S. Cl. ................................. 430/330; 430/311
[58] Field of Search ........................... 430/311, 328, 430/330, 331, 394, 396

[56] References Cited

U.S. PATENT DOCUMENTS

| | | | |
|---|---|---|---|
| 4,921,778 | 5/1990 | Thackeray et al. | 430/326 |
| 5,108,875 | 4/1992 | Thackeray et al. | 430/326 |
| 5,272,042 | 12/1993 | Allen et al. | 430/270 |
| 5,300,403 | 4/1994 | Angelopolus | 430/325 |
| 5,344,742 | 9/1994 | Sinta et al. | 430/270 |
| 5,350,660 | 9/1994 | Urano et al. | 430/176 |
| 5,358,599 | 10/1994 | Cathey | 156/643 |
| 5,366,851 | 11/1994 | Novembre | 430/322 |
| 5,385,809 | 1/1995 | Bohrer et al. | 430/311 |
| 5,516,608 | 5/1996 | Hobbs et al. | 430/30 |
| 5,556,734 | 9/1996 | Yamachika et al. | 430/270.1 |
| 5,558,978 | 9/1996 | Schädeli et al. | 430/270.1 |
| 5,585,507 | 12/1996 | Nakano et al. | 556/7 |

FOREIGN PATENT DOCUMENTS

| | | |
|---|---|---|
| 2001384 | 4/1990 | Canada . |

OTHER PUBLICATIONS

Mixon, D.A., et al., "Effect of Partial Deprotection on Lithographic Properties of t–Butoxycarbonyloxystyrene––Containing Polymers," *SPIE*, vol. 2195, pp. 297–306.

Hiroshi Ito, "Deep–UV Resists: Evolution and Status", *Solid State Technology*, Jul. 1996, pp. 164–173.

Nalamasu, Omkaram, et al., "Recent Progress in Resist Materials for 193 NM Lithography", *Future Fab International*, pp. 159–163.

Conley, Will, et al., "Performance of an Advanced DUV Photoresist for 256Mb DRAM Fabrication", *Future Fab International*, pp. 123–130.

*Primary Examiner*—Kathleen Duda
*Attorney, Agent, or Firm*—Pollock, Vande Sande & Amernick

[57] ABSTRACT

A process for reducing shrinkage of photolithographic features formed in a photoresist including exposing the photoresist to at least one material selected from the group consisting of at least one amine, at least one amide, at least one aldehyde, and nitrogen.

26 Claims, 6 Drawing Sheets

CONTROLLED AMINE POISONING FOR REDUCED SHRINKAGE OF FEATURES FORMED IN PHOTORESIST

FIELD OF THE INVENTION

The invention relates to a process for reducing shrinkage of features formed in photoresist by intentionally poisoning or chemically modifying the chemical structure of deep UV or chemically amplified (CAR) photoresist with at least one amine, at least one amide, at least one aldehyde, or nitrogen. The invention also relates to methods for forming semiconductor chip devices, semiconductor devices, and photostabilized photoresists.

BACKGROUND OF THE INVENTION

Microelectronic devices in integrated circuits are manufactured by means of photolithographic techniques. Fabricating various structures, particularly electronic device structures, typically involves depositing at least one layer of at least one photosensitive material, typically known as a photoresist material, on a substrate. The photoresist material may then be patterned by exposing it to radiation of a certain wavelength or wavelengths to alter characteristics of the photoresist material. Typically, the radiation is from the ultraviolet range of wavelengths. The radiation causes desired photochemical reactions to occur within the photoresist.

The photochemical reactions alter the solubility characteristics of the photoresist, thereby allowing removal of certain portions of the photoresist. Selectively removing certain parts of the photoresist allows for the protection of certain areas of the substrate while exposing other areas. The remaining portions of the photoresist typically are utilized as masks or stencils for processing the underlying portions of the substrate.

An example of such a process is in the fabrication of semiconductor devices wherein, for example, layers are formed on a semiconductor substrate. Certain portions of the layers may be removed to form openings through the layers. The openings may allow diffusion of desired impurities through the openings into the semiconductor substrate. Other processes are known for forming devices on a substrate.

Devices such as those described above, may be formed by introducing a suitable impurity into a layer of a semiconductor to form suitably doped regions therein. In order to provide distinct P or N regions, which are necessary for the proper operation of the device, introduction of impurities should occur through only a limited portion of the substrate. Usually, this is accomplished by masking the substrate with a resist material and subsequently etching a diffusion resistant material, such as silicon dioxide or silicon nitride to a desired depth to form a protective mask to prevent diffusion of the impurities through selected areas of the substrate.

The mask in such a procedure is typically provided by forming a layer of material over the semiconductor substrate and, afterward creating a series of openings through the layer to allow the introduction of the impurities directly into the underlying surface. These openings in the mask are readily created by coating the silicon wafer with a material known as a photoresist. Photoresists can be negative photoresist or positive photoresist materials.

A negative photoresist material is one which is capable of polymerizing and being rendered insoluble upon exposure to radiation, such as UV radiation. Accordingly, when employing a negative photoresist material, the photoresist is selectively exposed to radiation, causing polymerization to occur above those regions of the substrate which are intended to be protected during a subsequent operation. The unexposed portions of the photoresist are removed by a solvent which has a minimal effect on the polymerized portion of the photoresist.

Positive photoresist material is a material that, upon exposure to radiation, is capable of being rendered soluble in a solution, such as an aqueous alkaline solution in which the unexposed resist is not soluble. Accordingly, when applying a positive photoresist material, the photoresist is selectively exposed to radiation, causing the reaction to occur above those portions of the substrate which are not intended to be protected during the subsequent processing period. The exposed portions of the photoresist are removed by an aqueous alkaline solution which has a minimal impact on the unexposed portion of the resist.

Photoresist materials may similarly be used to define other regions of electronic devices.

In an effort to increase the capability of electronic devices, the number of circuit features included on, for example, a semiconductor chip, has greatly increased. When using a process such as that described above for forming devices on, for instance, a semiconductor substrate, increasing the capability and, therefore, the number of devices on a substrate requires reducing the size of the devices or circuit features.

One way in which the size of the circuit features created on the substrate has been reduced is to employ mask or reticle structures having smaller openings. Such smaller openings expose smaller portions of the semiconductor wafer surface to the radiation, thereby creating smaller structures in the photoresist. In order to produce smaller structures in the photoresist, shorter single wavelength ultraviolet radiation may also be used in conjunction with the mask or reticle to image the photoresist in order to achieve a maximized resolution of ever decreasing feature sizes.

After forming features in the photoresist, electronic device features may be formed in or on the substrate upon which the photoresist is deposited. However, prior to forming the devices, the photoresist may be subjected to a photostabilization process.

Photostabilization typically is a post-lithography process that can maintain resist feature sidewall profiles, minimize outgassing, minimize blistering, minimize resist popping and reduce resist residue and particles. Photostabilization makes photolithographic features more rigid and more robust so as to make them more resistant to subsequent processing. Photostabilization can also reduce process delays. Photostabilization is described in U.S. Pat. No. 4,548,688 issued Oct. 22, 1985, to Matthews for Hardening of Photoresist and Apparatus, the entire disclosure of which is hereby incorporated by reference.

Photostabilization utilizes electromagnetic energy, photons, typically in the Deep UV range and heat to cure or densify a photoresist. Preferably, the heat is applied by ramping up the temperature. Typically, the photoresist is subjected to UV radiation while simultaneously being heated. The radiation and heat initiates chemical cross-linking reactions within the resist.

Some researchers have found that photostabilization of features defined with a Deep UV or chemically amplified resists causes a shrinkage in features formed in the Deep UV photoresist. Such shrinkage is considered to be very detrimental to the subsequent formation of electronic device structures in and on the semiconductor wafer upon which photoresist is deposited. The shrinkage will occur along the length, width and height of the resist features. In other words, film thickness and critical dimension will both be affected by the photostabilization process.

Horizontal shrinkage, along the length or width, can result in significant undesirable change between the feature imaged in the photoresist and the subsequently etched feature. Vertical, or height, shrinkage may result in a diminished amount of resist, which may result in inadequate protection of the underlying substrate, particularly during anisotropic etching. Many practitioners have avoided the use of Deep UV resist photostabilization processes so as to attempt to minimize the shrinkage that is known to occur during the processing of Deep UV resists.

Typically, the substrate and photoresist are subjected to processes such as etch and implant directly after the formation of features in the photoresist, such as by photolithography. This is done even though it is known that a certain amount of shrinkage occurs during processes such as etch and implant. The shrinkage is simply calculated into the size of the features created in the photoresist. However, there are inherent uncertainties in the shrinkage that occurs during, for example, etching. Typically, shrinkage occurring during etching is not reproducible, is variable, and changes with the load on the etcher.

SUMMARY OF THE INVENTION

The present invention addresses the above and other problems by presenting a solution that reduces the phenomenon of shrinkage.

It is an object of the present invention to provide a method for reducing feature shrinkage of photoresist occurring during photostabilization and the formation of circuit features.

Aspects of the present invention provide a process for reducing shrinkage of photolithographic features formed in a photoresist by exposing the photoresist to at least one amine, at least one amide, at least one aldehyde, and/or nitrogen.

According to other aspects, the present invention provides a method for forming a semiconductor chip device. The method includes photolithographically forming features in a photoresist on a surface of a semiconductor wafer by exposing the photoresist to a wavelength or wavelengths of radiation sufficient to alter the solubility characteristics of the photoresist. The semiconductor wafer and the photoresist preferably are subjected to a post exposure bake process to finalize the chemical amplification process. The semiconductor wafer and the photoresist are subjected to a developing process. The photoresist is exposed to at least one amine, at least one amide, at least one aldehyde, and/or nitrogen to reduce shrinkage of the features formed in the photoresist during subsequent processing of the semiconductor wafer and the photoresist. The semiconductor wafer and the photoresist are processed to form circuit features in and/or on the semiconductor wafer.

Further aspects of the present invention provide a semiconductor device prepared according to a process including photolithographically forming features in a photoresist on a surface of a semiconductor wafer. The semiconductor wafer and the photoresist preferably are subjected to a post exposure bake process to finalize the chemical amplification process. The semiconductor wafer and the photoresist are then subjected to a developing process. Subsequently, the photoresist is exposed to at least one amine, at least one amide, at least one aldehyde, and/or nitrogen to reduce shrinkage of the features in the photoresist during subsequent processing of the semiconductor wafer to form circuit features in and/or on the semiconductor wafer.

Still further aspects of the present invention provide a photostabilized photoresist having features photolithographically formed therein and prepared according to a process that includes exposing the photoresist to at least one amine, at least one amide, at least one aldehyde, and/or nitrogen and subjecting the semiconductor wafer and the photoresist to a photostabilization process.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the drawings and description are to be regarded as illustrative in nature and not as restrictive.

DETAILED DESCRIPTION OF THE INVENTION

Figure 1:
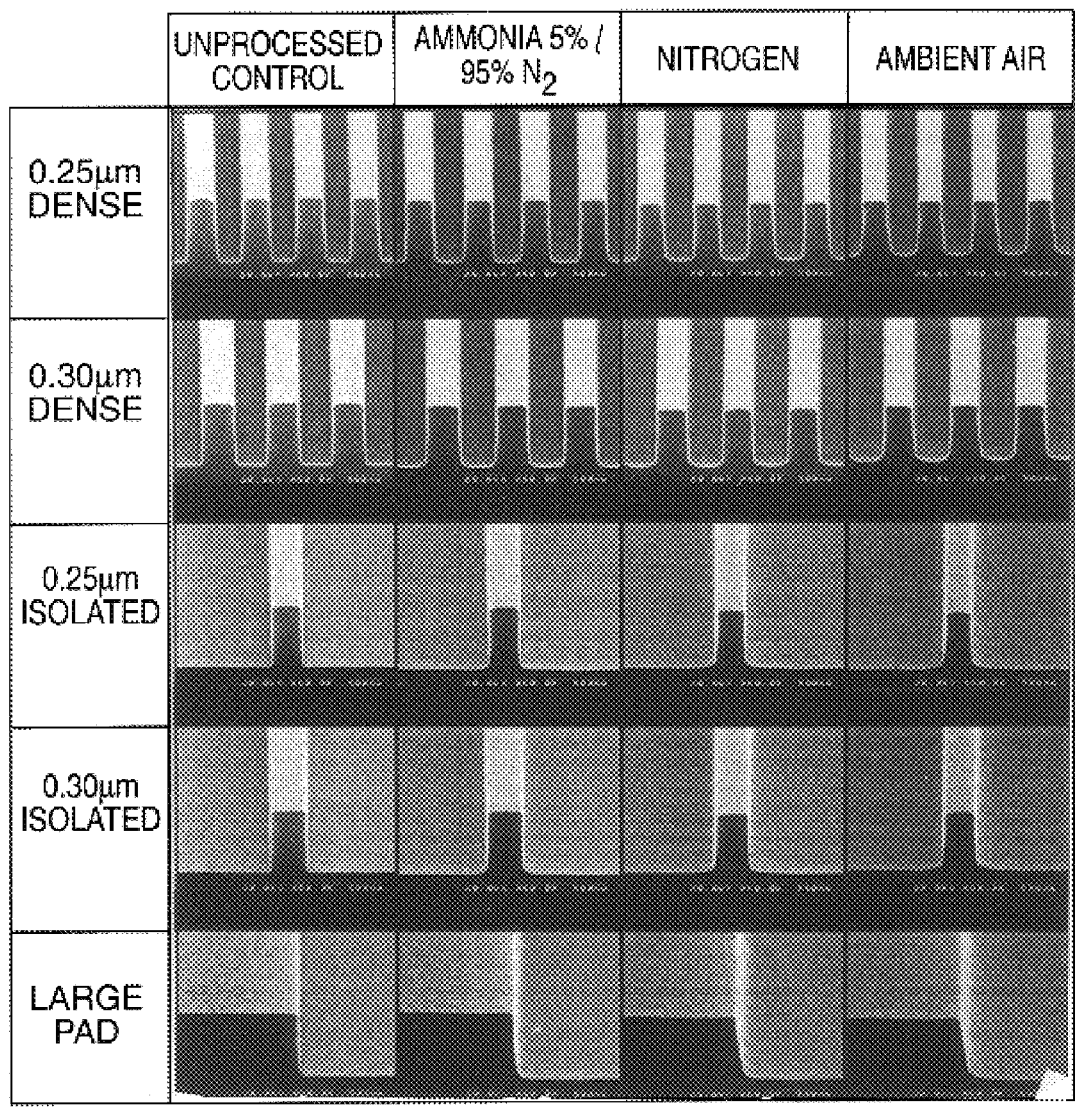
FIG. 1 represents a series of photomicrographs of isolated lines, group lines, and a large pad of photoresist illustrating the effects of treatment of the lines and the pad with an embodiment of an amine that may be utilized according to the present invention, unprocessed control samples, and the effects of treatment of the lines and the pad in the presence of other materials.

As discussed above, the phenomenon of shrinkage of features formed in Deep UV photoresist is known. Typically, avoiding any shrinkage of features formed in photoresist is a very important consideration in post formation processes. In fact, as discussed above, photostabilization processes are generally avoided with certain Deep UV resist processes due to the known shrinkage that occurs as a result of the processes.

However, even processes such as etch and implant cause shrinkage. An etcher may produce unpredictable, non-uniform shrinkage in photoresist. The non-uniformity of the shrinkage experienced when utilizing an etcher is compounded by materials that may build up in the etcher, altering the process conditions as the etcher is used more.

The shrinkage of resist features that occurs particularly during photostabilization is believed to be caused by UV generation of acid from a photoacid generator (PAG). Thermal energy, during both photostabilization and during subsequent high temperature manufacturing processes appears to initiate an acid-catalyzed deblocking of blocked polymers. Breakdown products of the blocking groups typically include low molecular weight hydrocarbon compounds with low boiling points that are easily volatilized out of the resist.

Generating acid in the photoresist is considered desirable for realizing imaged features. This is particularly so in chemically amplified photoresists. As a result, anything that hinders the development of the acids is considered to be detrimental to the realization of features in photoresists.

Materials that are considered to hinder the development of features in photoresist include amines. Amines are considered undesirable, particularly to "bulk" photoresists, due to the ability of the amines to block acid generation.

The present invention takes a material, amines, in particular, that is considered detrimental to forming features in photoresist and subsequent processing of the photoresist and turns it into a means for creating more stable features in photoresist that experience a reduced amount of shrinkage. It is felt that the reduced shrinkage results at least in part from the fact that after images have been completely formed in the photoresist by development, amine poisoning is no longer a factor since the utility of acid generation is no longer important and the action of the amines in blocking acid generation is no longer detrimental to image formation or deformed images. By neutralizing or "quenching" any acid generated by UV photoactivation of photoacid generators during photostabilization and subsequent processing, the amines helped to prevent shrinkage experienced during these processes.

By reducing or eliminating shrinkage during photostabilization and subsequent processing, the present invention introduces a higher degree of predictability to semiconductor device formation than is currently known. By reducing or eliminating shrinkage, the present invention avoids the need to increase resist thicknesses to compensate for shrinkage. Additionally, the unpredictable shrinkage that may occur during etch and implant, for example, are reduced or eliminated.

The inventors of the present invention have unexpectedly discovered that the shrinkage occurring during photostabilization and other processing can be reduced. The present invention reduces photoresist shrinkage through the intentional perturbation and modification of the resist through the use of controlled amine poisoning. The present invention is particularly useful with chemically amplified photoresists in order to prevent shrinkage that occurs during photostabilization.

Of course, the reduction in shrinkage according to the present invention may vary, depending upon the process parameters utilized. The process parameters will be discussed below in greater detail.

According to one embodiment of the process according to the present invention, photoresist, in which features have been photolithographically formed is exposed to at least one amine. It has also been discovered that the photoresist may also be exposed to at least one amide, at least one aldehyde, and/or nitrogen. The present invention is particularly useful with chemically amplified photoresists. Such photoresists are discussed below in greater detail.

The use of at least one amine, at least one amide, at least one aldehyde, and/or nitrogen may be in a vaporous or gaseous form. The at least one amine, at least one amide, at least one aldehyde, and/or nitrogen may also be in a mixture of gases. The total concentration may range from less than about 1% in combination with an inert gas or vapor. Alternatively, at least one amine, at least one amide, at least one aldehyde, and/or nitrogen may be used in higher concentrations as may be necessary to fulfill the requirements of minimized shrinkage. This concentration may be as high as 100% amine, amide, aldehyde, and/or nitrogen for certain applications and for certain resist materials.

Amine as used herein may include ammonia ($NH_3$) and/or one or more amines. The amine(s) that the photoresist may be exposed to may include any one or more amine(s). The amines may be primary, secondary or tertiary. Examples of specific amines that may be used include $RNH_2$, $R_2NH$, $R_3N$, where R may be any hydrocarbon substitute. For example, R, $R_2$, and $R_3$ may be alkyl groups. Typically, the R, $R_2$, and $R_3$ may be alkyl groups having from 1 to 12 carbon atoms. More typically, R, $R_2$, and $R_3$ may be an alkyl group of from 1 to 6 carbon atoms. One example of an alkyl group is a methyl group.

As stated above, also included, in addition to or in place of the at least one amine can be at least one aldehyde and/or at least one amides ($R_1$—NCO—$R_2$). One example of an aldehyde is formaldehyde. Typically, such aldehydes include from 1 to 12 carbon atoms. More typically, the aldehydes have from 1 to 6 carbon atoms.

In the case of amides, $R_1$ and $R_2$ may be any hydrocarbon substitute. For example, $R_1$ and $R_2$ may be alkyl groups. Typically, $R_1$ and $R_2$ may be alkyl groups having from 1 to 12 carbon atoms. More typically, $R_1$ and $R_2$ may be alkyl groups of from 1 to 6 carbon atoms. One example of an alkyl group is a methyl group. One example of an amide is 2N-methyl pyrrolidone, commonly known as NMP.

Of course, the amine, amide, aldehyde, and/or nitrogen utilized may depend upon a variety of factors. For example, certain amines, amides, or aldehydes may be more effective with certain photoresists based upon the structure of the amine, amide, or aldehyde and the structure of the photoresist. Determining which amines, amides, aldehydes, and/or nitrogen are most suitable for a specific photoresist and a specific process is certainly within the scope of routine examination by one skilled in the art and once aware of the present disclosure.

Additionally, prior to carrying out a process according to the present invention, the shrinkage profile of a photoresist may be determined. The shrinkage profile may include the amount of shrinkage typically experienced in photolithographic features formed in the photoresist when exposing the features to a variety of photostabilization, hard baked, etch, implant, and/or other processes. The shrinkage profile might depend upon the dimensions of the photolithographic features formed in the photoresist. Once aware of the present disclosure, one skilled in the art could determine the shrinkage profile of a photoresist without undue experimentation.

According to embodiments of the present invention, the photoresist and the photolithographically features formed therein, may be subjected to the at least one amine, at least one amide, at least one aldehyde, and/or nitrogen for a time of from about 10 seconds to about 300 seconds. The period of time that the photoresist may be exposed to the amines may vary, depending upon the photoresist, the amine, amide, aldehyde, and/or nitrogen and the desire degree of shrinkage reduction, among other factors. The period of time that the photoresist is exposed to the at least one amine, at least one amide, at least one aldehyde, and/or nitrogen may be long enough to impregnate a majority of the photoresist with the amine. Alternatively, the period of time that the photoresist is exposed to the at least one amine may be sufficient to reduce the amount of shrinkage experienced in the photoresist during processing occurring after the formation of photolithographic features in the photoresist.

In order to realize features which have a minimal amount of shrinkage and are robust for subsequent processing, the resist features preferably are also subjected to elevated temperatures. The photostabilization process as defined previously, describes examples of elevated temperatures and process parameters involved in the provision of the elevated temperatures.

During processes according to the present invention, the resist features may be subjected to UV radiation and a controlled ramp to an elevated temperature as required by the specific process while additionally being subjected to at least one amine, at least one amide, at least one aldehyde, and/or nitrogen vapor or gas. This process may help to minimize the shrinkage while rendering the features robust for subsequent processing at etch or ion implant.

Additionally, it may be a requirement to process wafers during the photostabilization process with the use of at least one amine, at least one amide, at least one aldehyde, and/or nitrogen in a sub-atmospheric or vacuum chamber. According to such processes, the wafer may be placed into a processing chamber. The pressure could then be reduced to a certain level. For example, the pressure may be reduced to a level of from about 12 torr to about $10^{-5}$ torr. Alternatively, the pressure may be reduced to a level of about 12 torr to about $10^{-3}$ torr or to a level of from about $10^{-3}$ torr to about $10^{-5}$ torr. After reducing the pressure, the photostabilization process would begin. Before, during or after beginning the photostabilization process, at least one amine, at least one amide, at least one aldehyde, and/or nitrogen vapor or gas may be introduced into the processing chamber to realize the minimization of feature shrinkage.

This reduced pressure requirement is included as an alternative method deviation from the photostabilization process described by Matthews, referred to above. According to the present invention, the process should work in both atmospheric and sub-atmospheric conditions. However, a sub-atmospheric or vacuum chamber may be a requirement for some end users. The use of a sub-atmospheric or vacuum chamber does not change the premise of this disclosure or invention, or end process results. Therefore, operating in a sub-atmospheric or vacuum chamber is illustrative of one way to carry out the processes of the present invention, not the only way.

The present invention also includes methods for forming semiconductor chip devices. According to the methods, features are photolithographically formed in a photoresist deposited on a semiconductor wafer by exposing the photoresist to wavelengths of radiation sufficient to alter the solubility characteristics of the photoresist. More details of such standard processes are discussed above. The semiconductor wafer and the photoresist with the features formed thereon are subjected to a developing process to remove the relevant portions, whether positive or negative, of the photoresist. Although the present invention is most useful with positive photoresists.

The remaining photoresist is then exposed to at least one amine, at least one amide, at least one aldehyde, and/or nitrogen to reduce shrinkage of the features during subsequent processing of the semiconductor wafer and the photoresist. The photoresist and semiconductor wafer may then be processed to form circuit features in and/or on the semiconductor wafer. The above-discussion regarding the amine, amide, aldehyde, and or nitrogen exposure applies to the processes of forming the semiconductor chip devices here as well.

The methods of forming semiconductor devices may also include the step of subjecting the semiconductor wafer and the photoresist to a photostabilization process after and/or during the exposure of the photoresist to the at least one amine, at least one amide, at least one aldehyde, and/or nitrogen.

Also, the methods of forming semiconductor chip devices may include subjecting the semiconductor wafer and the photoresist to a post exposure bake process prior to subjecting the photoresist to the developing process. The post exposure bake process preferably occurs prior to exposing the photoresist to the at least one amine, at least one amide, at least one aldehyde, and/or nitrogen. The photostabilization process may include the steps described in the Matthews patent, referred to above. Alternatively, the process may be modified to meet requirements of the present invention.

However, the basic premise is the same, however, the addition of at least one amine, at least one amide, at least one aldehyde, and/or nitrogen to the photostabilization process according to the present invention may warrant a modification to the basic process structure as described by Matthews. This in no way implies that the use of UV irradiance and controlled thermal ramping need to be eliminated. The addition of the at least one amine, at least one amide, at least one aldehyde, and/or nitrogen to the process may or may not require the use of a vacuum chamber or a sub-atmospheric chamber to do the processing in addition to the controlled thermal ramping while simultaneously irradiating the wafer with UV radiation.

According to processes of the present invention, the photolithographic features, as formed, have a minimum width of about 0.35 $\mu$m to about 0.05 $\mu$m. After exposure to at least one amine, at least one amide, at least one aldehyde, and/or nitrogen and the formation of circuit features, the photolithographic features have a minimum width of about 0.35 $\mu$m to about 0.05 $\mu$m. In other words, the features may shrink from about 0 percent to about 5 percent. In other words, the amount of shrinkage may be reduced from about 100 percent to about 50 percent.

The present invention also includes semiconductor devices prepared according to a process that includes photolithographically forming features in a photoresist on a surface of a semiconductor wafer. The semiconductor wafer and the photoresist are subjected to a developing process. The photoresist is exposed to at least one amine, at least one amide, at least one aldehyde, and/or nitrogen to reduce shrinkage of the features in the photoresist during subsequent processing of the semiconductor wafer and the photoresist. The semiconductor wafer the photoresist are then processed to form circuit features in and/or on the semiconductor wafer. The discussion above regarding details of the photoresist and the semiconductor wafer processing, including the exposure to at least one amine, at least one amide, at least one aldehyde, and/or nitrogen apply here to the description of semiconductor devices according to the present invention.

The present invention also includes a photostabilized photoresist having features photolithographically formed therein and are prepared according to a processing including exposing the photoresist to at least one amine, at least one amide, at least one aldehyde, and/or nitrogen and subjecting the semiconductor wafer and the photoresist to a photostabilization process. Once again, the above discussion regarding the details of the at least one amine, at least one amide, at least one aldehyde, and/or nitrogen exposure apply here as well.

Methods of photolithographically forming features in photoresists, methods of exposing photoresist, post exposure bake processes, developing processes, and methods for forming circuit features in and/or on semiconductor wafers are known. For examples of such processes, please see P. van Zant, Microchip Fabrication, McGraw-Hill, 1997, or L. Thompson, G. Willson, M. Bowden, Introduction to Microlithography, 2nd Edition, American Chemical Society, 1994, the entire contents of both of these publications are hereby incorporated by reference.

The present invention is particularly useful for treating Deep UV photoresists. In particular, the present invention is particularly useful for treating chemically amplified photoresists. Examples of such resists include formulations composed of photoacid generators and blocked polymer resins of varying molecular weight.

Examples of blocked polymers include

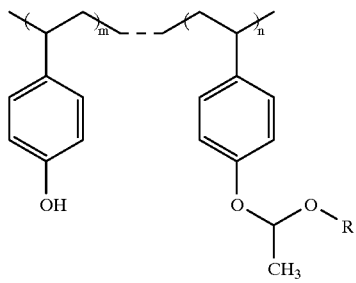

Poly(4-hydroxystyrene-co-4-[1-alkoxyethoxy]styrene), where R=an alkyl group or
Poly(4-hydroxystyrene-co-4-[1-aryloxyethoxy]styrene), where R=an aryl group,

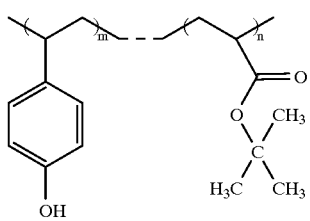

Poly(4-hydroxystyrene-co-t-butylacrylate); and

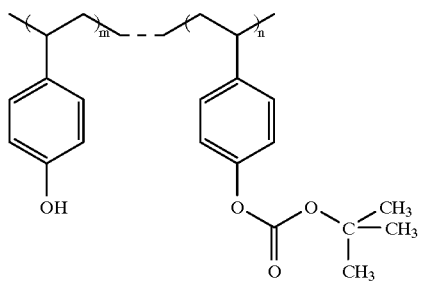

Poly(4-hydroxystyrene-co-t-butylcarbonylhydroxystyrene).

However, any photoresist that requires chemical amplification may be utilized. Other photoresists that the present invention may be utilized with include polyhydroxystyrene (PHS), blocked-polyhydroxystyrene and/or methacrylates, such as polymethylmethacrylate (PMMA). The photoresists may be utilized as homopolymers including acid labile additives or as a copolymer including acid labile groups. The present invention may be used with any material used in conjunction with acid labile groups requiring chemical amplification for realization of images. It may also prove useful on DNQ resist types which do not require chemical amplification. The present invention is particularly useful with positive photoresists.

Examples of photoresists that the present invention may be utilized with may be found in Ito, Deep-UV resists: Evolution and status, Solid State Technology, July 1996, pp. 164–173; Conley et al., Performance of an advanced DUV photoresist for 256Mb DRAM fabrication, Future Fab International, pp. 123–130; and Nalamasu et al., Recent progress in resist materials for 193 nm lithography; Future Fab International, pp. 159–163, the entire disclosures of all of which are hereby incorporated by reference.

FIG. 1 represents a series of photomicrographs illustrating the effects of the present invention on actual samples of photoresist as well as the effects of processing under other conditions. The photoresist used in all of the examples shown in FIG. 1 contains the blocked polymer resin, 4-hydroxystyrene-co-t-butyl acrylate. Also, all of the samples shown in FIG. 1 were processed in a post exposure bake process described above.

The photoresist shown in the first column of micrographs shown in FIG. 1 were unprocessed. The photoresist shown in the second column of micrographs shown in FIG. 1 were, processed in an atmosphere including about 5% ammonia, about 95% nitrogen. Additionally, the photoresist shown in the third column of micrographs shown in FIG. 1 were processed in an atmosphere containing 100% nitrogen ($N_2$) gas. Also, the photoresist shown in the fourth column of micrographs shown in FIG. 1 were processed under an ambient air atmosphere having a relative humidity of about 40%.

Ambient air may have a humidity of from about 35% to about 55%. On the other hand, Clean Dry Air (CDA) may have a relative humidity of about 0%. The humidity level of CDA may vary by about 2% to about 3%.

The photoresist shown in the first row of photomicrographs shown in FIG. 1 illustrates the processing of about 0.25 μm grouped lines of photoresist in the conditions listed above for the columns 1–4. Row 2 of photomicrographs illustrates the effects of processing in the conditions listed above for the columns 1–4 for densely grouped lines of photoresist about 0.30 μm wide. Additionally, row 3 of micrographs illustrates the effects of processing in the conditions listed above for the columns 1–4 for isolated lines of photoresist about 0.25 μm wide. Similarly, row 4 of micrographs illustrates the effects of processing in the conditions listed above for the columns 1–4 for isolated lines of photoresist about 0.30 μm wide. On the other hand, row 5 of micrographs illustrates the effects of processing in the conditions listed above for the columns 1–4 for a large pad of photoresist.

As can be seen in FIG. 1, the present invention has a profound effect on the shrinkage of the photoresist. The micrographs shown in column 2 show very little change relative to the unprocessed sample. On the other hand, the samples processed in nitrogen and air show dramatically greater shrinkage.

Figure 2:
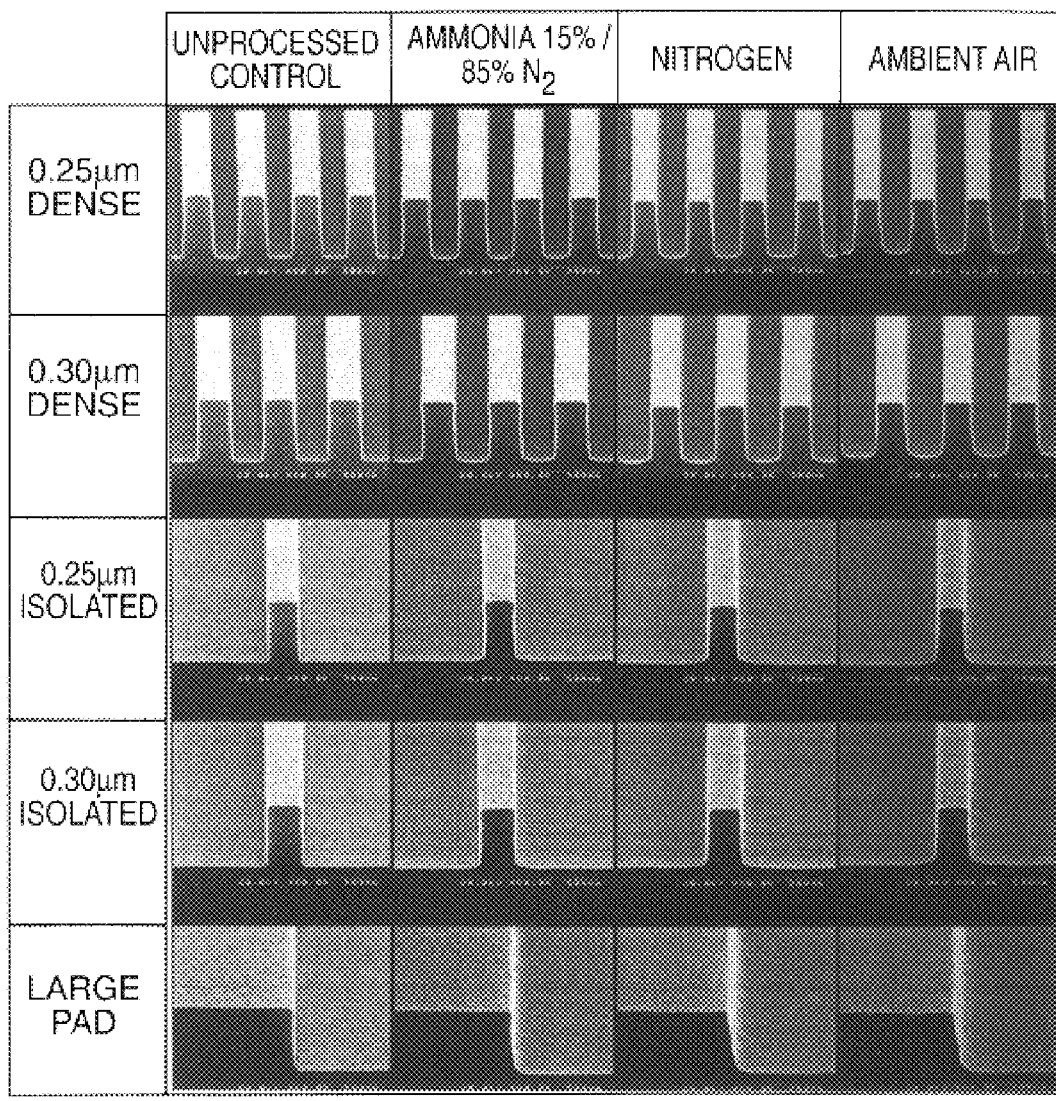
FIG. 2 represents a series of photomicrographs of isolated lines, group lines, and a large pad of photoresist illustrating the effects of treatment of the lines and the pad with another embodiment of an amine that may be utilized according to the present invention, unprocessed control samples, and the effects of treatment of the lines and the pad in the presence of other materials.

FIG. 2 also represents a series of photomicrographs illustrating the effects of the present invention on actual samples of photoresist as well as the effects of processing under other conditions. The arrangement of rows and columns in FIG. 2 is the same as FIG. 1 except that the amine utilized in the processing of the samples shown in column 2 includes about 15% $NH_3$ and about 85% $N_2$. FIG. 2 also illustrates the dramatic results achievable with the present invention.

Figure 3:
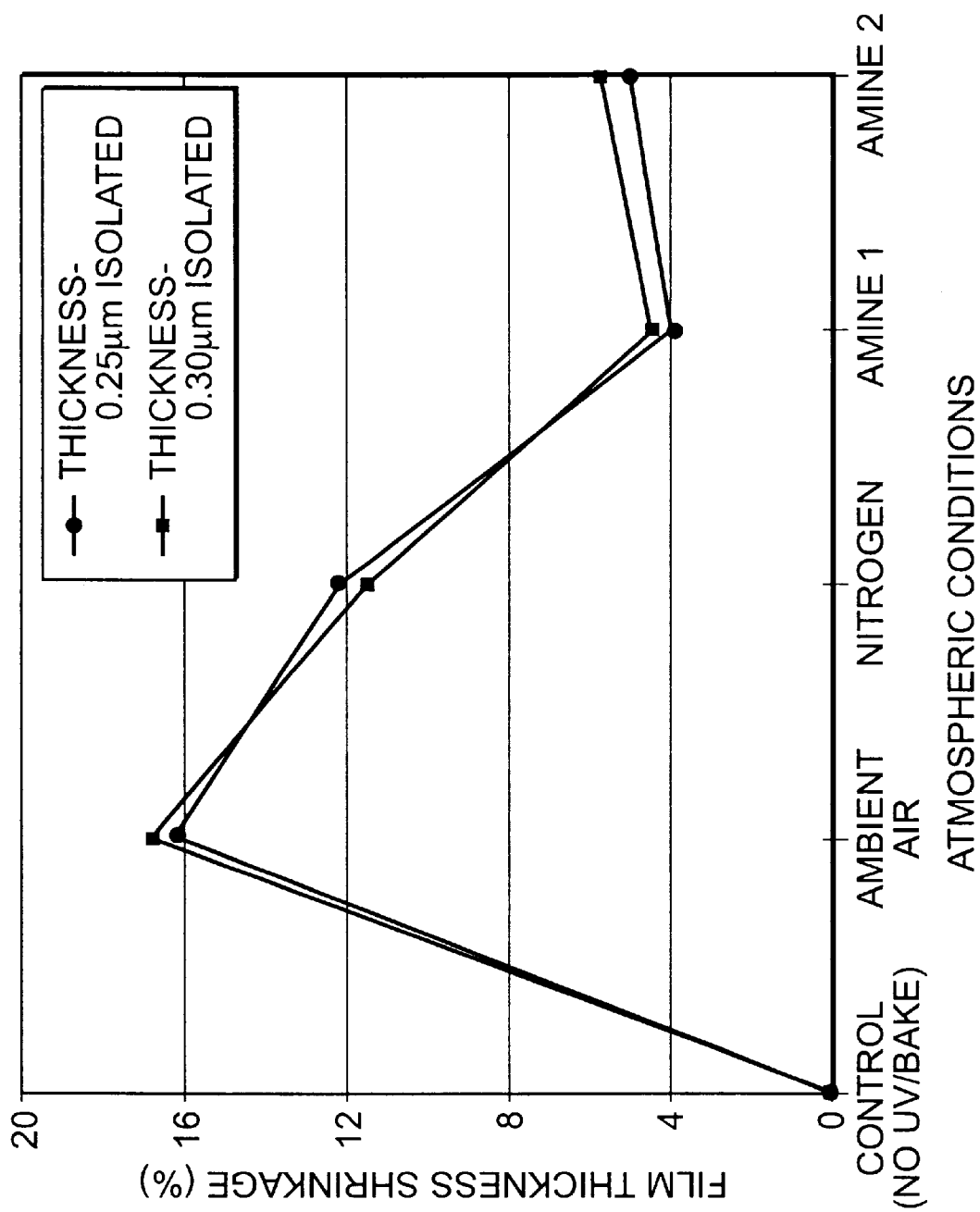
FIG. 3 represents a graph illustrating the effect on resist film shrinkage percent of isolated lines of two different thicknesses processed with the two amines, the effects of which are shown in FIG. 1 and FIG. 2, the effects of treatment of the lines in the presence of other materials, and an untreated sample.

FIG. 3 represents a line graph showing film thickness shrinkage percent as a function of atmospheric conditions that the resist is processed in. As with the resist shown in the photomicrographs in FIG. 1, the photoresist that has been processed to produce the results shown in FIG. 3 contains the blocked polymer resin, 4-hydroxystyrene-co-t-butyl acrylate. The processing is as described above, including a photostabilization process.

The photoresist described by the graph shown in FIG. 3 was formed in isolated lines of about 0.25 μm indicated by the diamond-shaped data points, or isolated lines of about 0.30 μm, as indicated by the square data points. The first, or left most, data point illustrates an unprocessed control sample. The second data point represents a sample processed in ambient air having a humidity level as described above. The third sample has been processed in an atmosphere containing nitrogen. The fourth and fifth samples were processed in an atmosphere of amine 1 and amine 2, respectively. Amine 1 and amine 2 referred to herein are atmospheres that contain about 5% $NH_3$ and about 95% $N_2$ or about 15% $NH_3$ and about 85% $N_2$, respectively.

Of course, there is no shrinkage seen in the control sample. When processing the photoresist in an atmosphere including $N_2$, the shrinkage was somewhat less. However, when processing the photoresist in one of the amines, the shrinkage was dramatically less. FIG. 3 illustrates graphically the results shown by the photomicrographs in FIGS. 1 and 2.

Figure 4:
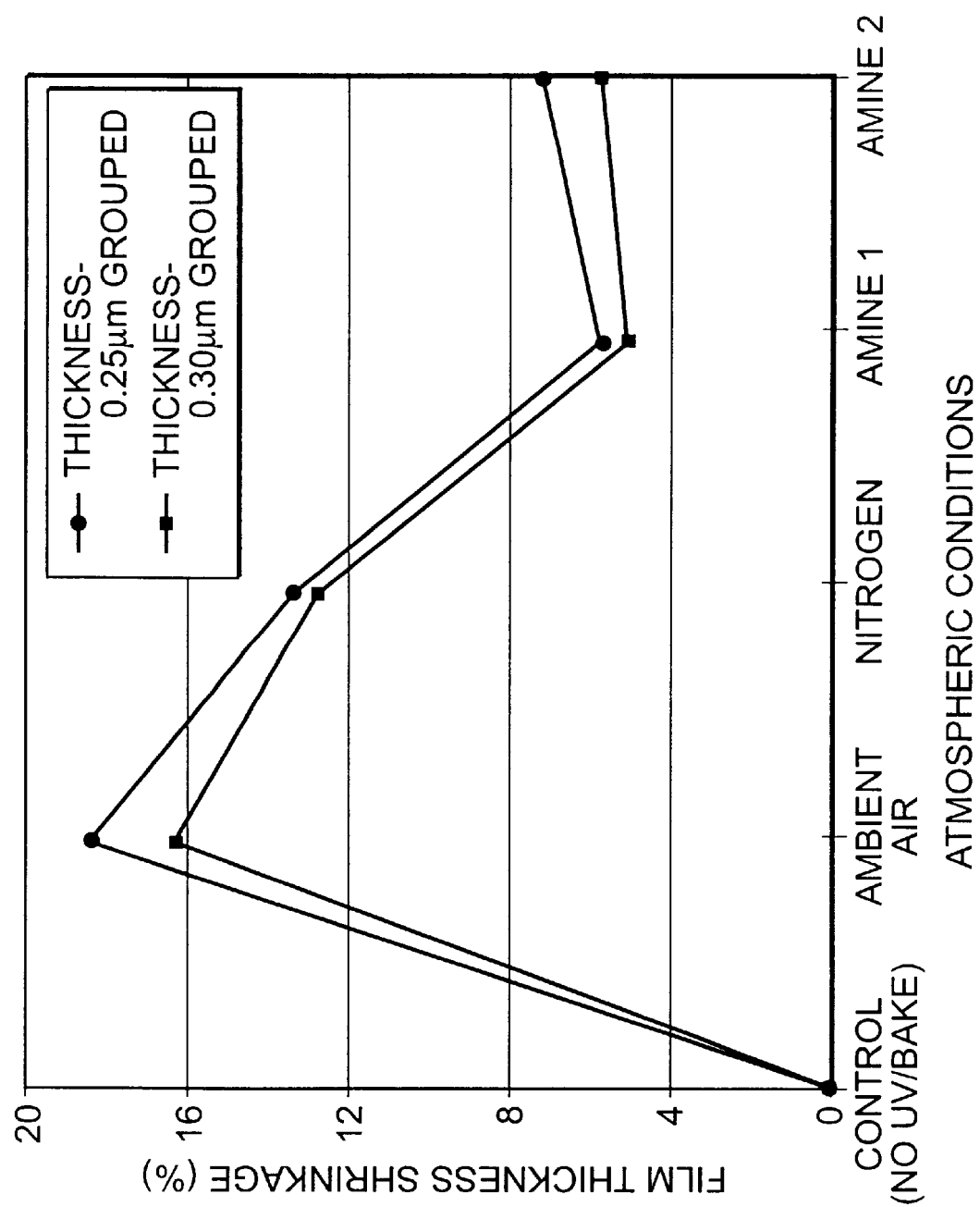
FIG. 4 represents a graph illustrating the effect on resist film shrinkage percent of grouped lines of two different thicknesses processed with the two amines, the effects of which are shown in FIG. 1 and FIG. 2, the effects of treatment of the lines in the presence of other materials, and an untreated sample.

FIG. 4 is similar to FIG. 3 with the exception that the lines of photoresist are grouped lines of approximately the same width as the isolated lines of photoresist described by the results shown in FIG. 3. FIG. 4 also illustrates the film thickness shrinkage percentage and processing atmospheric conditions.

Figure 5:
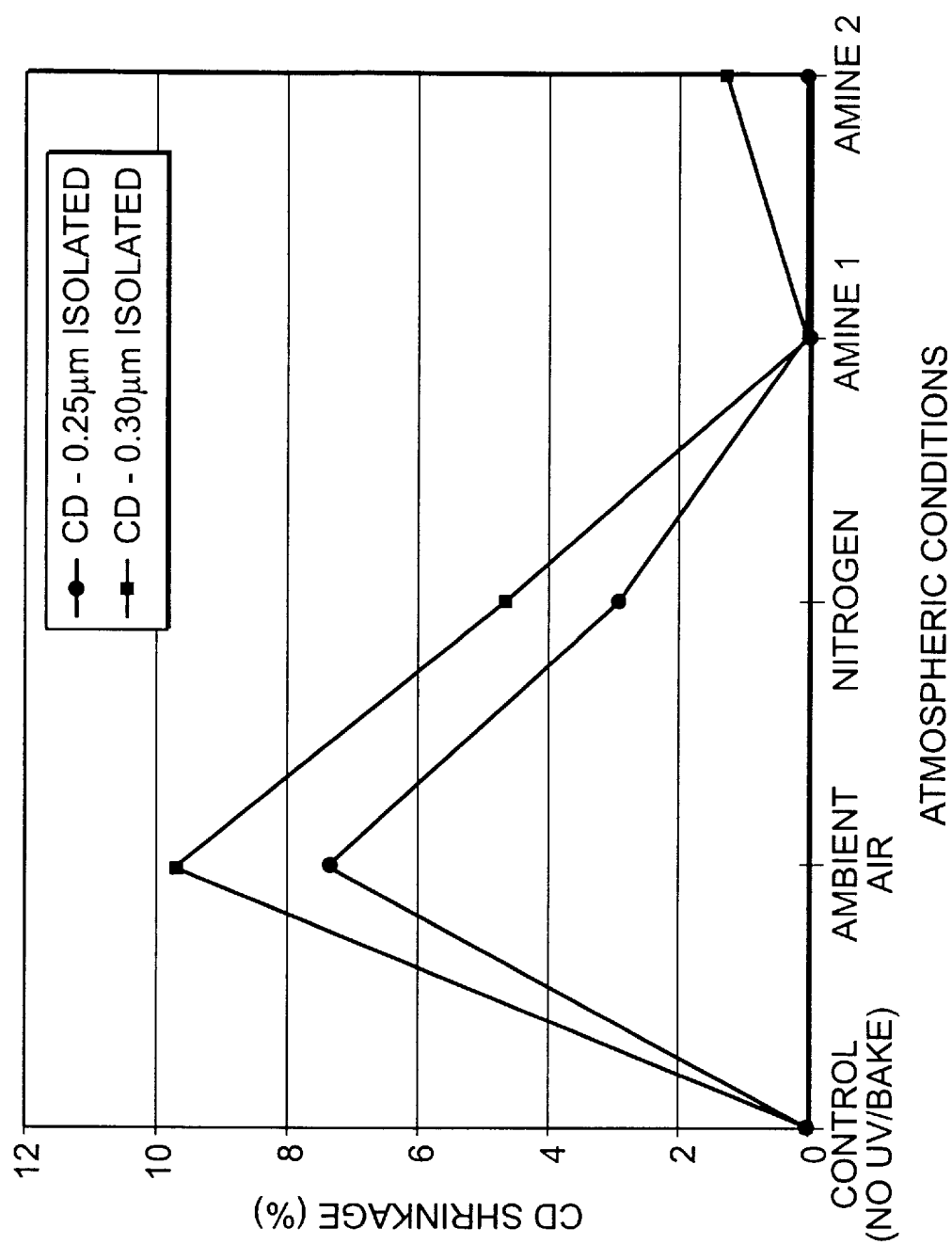
FIG. 5 represents a graph illustrating the effect on critical dimension shrinkage percent of isolated lines of two different critical dimensions processed with the two amines, the effects of which are shown in FIG. 1 and FIG. 2, the effects of treatment of the lines in the presence of other materials, and an untreated sample.

FIG. 5 illustrates the results of processing similar to FIG. 3 with the exception that, rather than showing film thickness shrinkage percent as a function of atmospheric conditions, FIG. 5 illustrates the results of critical dimension shrinkage percent as a function of atmospheric conditions. The photoresist that has been processed and the results shown in FIG. 5 was formed in isolated lines of about the same width as the lines described by the results shown in FIG. 3.

Figure 6:
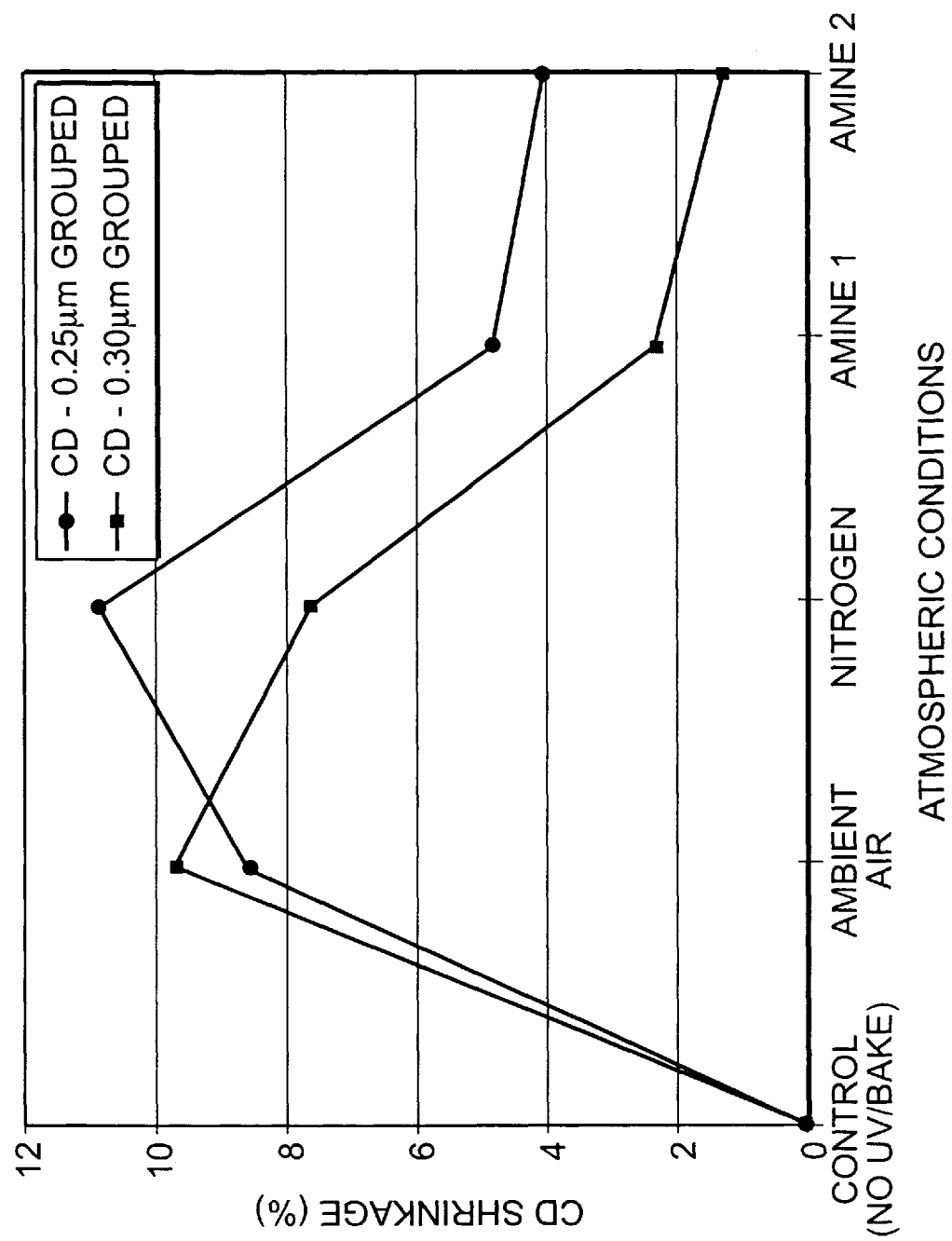
FIG. 6 represents a graph illustrating the effect on critical dimension shrinkage percent of grouped lines of two different critical dimensions processed with the two amines, the effects of which are shown in FIG. 1 and FIG. 2, the effects of treatment of the lines in the presence of other materials, and an untreated sample.

Similarly, FIG. 6 illustrates the effects of processing on the critical dimension of grouped lines of photoresist as a percentage of the original measurement of the critical dimension. The grouped lines, whose shrinkage is illustrated in FIG. 6, were similarly formed with a critical dimension of about 0.25 μm and about 0.30 μm, as illustrated by the diamond-shaped and square data points, respectively with FIGS. 3–5, FIG. 6 shows processing of the photoresist in ambient air, nitrogen-containing atmosphere, an atmosphere including at least one amine, and an atmosphere including at least a second amine. The first and second amines have the same definition as above. As also similar to the above, the atmosphere including the first amine and the second amine may also include other gaseous materials. FIG. 6 also shows a control sample.

As can be seen in FIGS. 3–6, the amount of shrinkage of the photoresist both in thickness and critical dimension is greatly reduced or substantially entirely eliminated when processing the photoresist with an atmosphere that contains an amine. For example, as seen in FIG. 3, the shrinkage of film thickness may be reduced by about 75%, as compared to when the photoresist is processed in ambient air. Similarly, the percent shrinkage in critical dimension on isolated lines may be entirely eliminated in certain instances, as shown in FIG. 5.

A third amine may be an atmosphere including about 15% monomethylamine. This amine has been found to have approximately the same effect as an atmosphere containing about 15% $NH_3$. Again, the remaining portion of the atmosphere may be $N_2$. A fourth amine includes about 15% dimethylamine. Similarly, the remaining portion of the atmosphere may be $N_2$. A fifth amine that may be utilized according to the present invention includes about 15% trimethylamine. The remaining portion of the atmosphere may be $N_2$. Similarly to the third amine and the fourth amine, the remaining portion of the atmosphere may be $N_2$. With the third, fourth and fifth amines and anywhere $N_2$ is utilized, at least one inert gas, such as helium, argon, neon, xenon, and/or krypton may also be utilized in place of or in addition to the $N_2$.

As demonstrated by the Examples, various amines and/or other gases and/or vapors may be utilized according to the present invention. Additionally, the present invention also includes the introduction of at least one amine, at least one amide, at least one aldehyde, and/or $N_2$, and/or at least one inert gas simultaneously. Alternatively, gas and/or vapor of at least one amine, at least one amide, at least one aldehyde, and/or $N_2$, and/or at least one inert gas may be introduced at multiple times during the processing. For example, an amine could be introduced, followed by $N_2$, and then another amine. There may be some overlap in the administration of the gas(es) and/or vapor(s). Any combination of administration gas and/or vapor of the at least one amine, at least one amide, at least one aldehyde, and/or $N_2$, and/or inert gas may be used. In some instances, the sequence of administration of gas(es) and/or vapor(s) may be controlled to accelerate cross linking reactions taking place in the photoresist.

Among the advantages of the present invention are greatly reducing or eliminating shrinkage of features formed in photoresist during processing of the photoresist. Such a process provides greatly enhanced predictability in processing. The present invention may also cut processing time required to process the photoresist. If the photoresist is processed in atmosphere including a reduced pressure, the present invention may also help to remove solvents in the photoresist by greatly reducing the boiling temperature of the solvents as a result of the reduced pressure. The solvents may be present in the photoresist as a result of formation or processing of the photoresist.

Although five different amines are described above for use in processing photoresists, any number of amines, amides, and/or aldehydes may be utilized. Additionally, although the examples above utilized a well known, readily available, commercial Deep UV photoresist containing the 4-hydroxystyrene-co-t-butyl acrylate blocked polymer resin, any number of Deep UV resists may be utilized. Along these lines, the photoresists may have similar structures or act in a similar manner or have similar characteristics as the photoresist containing the blocked polymer resin, 4-hydroxystyrene-co-t-butyl acrylate.

As demonstrated by the Examples, various amines and/or other gases and/or vapors may be utilized according to the present invention. Additionally, the present invention also includes the introduction of at least one amine, at least one amide, at least one aldehyde, and/or $N_2$, and/or at least one inert gas simultaneously. Alternatively, gas and/or vapor of at least one amine, at least one amide, at least one aldehyde, and/or $N_2$, and/or at least one inert gas may be introduced at multiple times during the processing. For example, an amine could be introduced, followed by $N_2$, and then another amine. There may be some overlap in the administration of the gas(es) and/or vapor(s). Any combination of administration gas and/or vapor of the at least one amine, at least one amide, at least one aldehyde, and/or $N_2$, and/or inert gas may be used. In some instances, the sequence of administration of gas(es) and/or vapor(s) may be controlled to accelerate cross linking reactions taking place in the photoresist.

According to some examples of the present invention, $N_2$ and $O_2$ may be used. One such embodiment utilizes about 50% $N_2$ and about 50% $O_2$.

According to other examples of the present invention, at least one amine may be administered to the processing environment. Then, at least one inert or reactive gas, such as oxygen, may be administered.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described herein above are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

We claim:

1. A process for reducing shrinkage of photolithographic features formed in a photoresist, said process comprising the steps of:

exposing said photoresist to at least one material selected from the group consisting of at least one amine, at least one amide, at least one aldehyde, and nitrogen after a feature forming exposure of the photoresist.

2. The process according to claim 1, wherein said photoresist is a chemically amplified photoresist.

3. The process according to claim 1, wherein said photoresist is selected from the group consisting of resists composed of photoacid generators and blocked polymer resins.

4. The process according to claim 1, wherein said photoresist is a chemically amplified photoresist.

5. The process according to claim 1, wherein said photoresist is selected from the group consisting of polyhydroxystyrene, blocked polyhydroxystyrene, methacrylates, and blocked methacrylates.

6. The process according to claim 1, wherein said at least one amine is in a form selected from the group consisting of a vapor, a gas, a mixture of gases, and a mixture of vapors.

7. The process according to claim 1, wherein said at least one amine is a primary, secondary or tertiary amine.

8. The process according to claim 1, wherein said at least one amine is selected from the group consisting of $NH_3$, $RNH_2$, $R_2NH$, and $R_3N$, where R is an alkyl group including from 1 to 12 carbon atoms.

9. The process according to claim 1, wherein said photoresist is subjected to said at least one amine, said at least one amide, said at least one aldehyde, or said nitrogen for a time of from about 10 seconds to about 300 seconds.

10. The process according to claim 1, wherein exposure to said at least one amine, said at least one amide, said at least one aldehyde, or said nitrogen results in said photolithographic features being impregnated with said at least one amine, said at least one amide, said at least one aldehyde, or said nitrogen.

11. The process according to claim 1, wherein said photoresist is exposed to said at least one amine, said at least one amide, said at least one aldehyde, or said nitrogen to a degree sufficient to reduce the amount of shrinkage that said photoresist experiences during processing that occurs after formation of said features in said photoresist.

12. A process for forming a semiconductor chip device, said method comprising the steps of:

photolithographically forming features in a photoresist on a surface of a semiconductor wafer by exposing said photoresist to wavelengths of radiation sufficient to alter the solubility characteristics of the photoresist;

subjecting said semiconductor wafer and said photoresist to a post exposure bake process;

subjecting said semiconductor wafer and said photoresist to a developing process;

exposing said photoresist to at least one material selected from the group consisting of at least one amine, at least one amide, at least one aldehyde, and nitrogen to reduce shrinkage of said features in said photoresist during subsequent processing of said semiconductor wafer and said photoresist; and processing said semiconductor wafer and said photoresist to form circuit features at least on the semiconductor wafer.

13. The process according to claim 12, further comprising the step of:

subjecting said semiconductor wafer and said photoresist to a photostabilization process after exposing said photoresist to said at least one amine, said at least one amide, said at least one aldehyde, or said nitrogen.

14. The process according to claim 12, further comprising the step of:

subjecting said semiconductor wafer and said photoresist to a post exposure bake process prior to subjecting said photoresist to said developing process.

15. The process according to claim 13, wherein photostabilization process includes subjecting said photoresist to ultraviolet radiation and heat.

16. The process according to claim 12, wherein said at least one amine, said at least one amide, said at least one aldehyde, or said nitrogen is in a form selected from the group consisting of a vapor, a gas, and a mixture of gases.

17. The process according to claim 12, wherein said at least one amine is any primary, secondary, or tertiary amine.

18. The process according to claim 12, wherein the photoresist is exposed to at least one amine selected from the group consisting of $NH_3$, $RNH_2$, $R_2NH$, and $R_3N$, where R is an alkyl group including from 1 to 12 carbon atoms.

19. The process according to claim 12, wherein as formed said photolithographic features have a minimum width of from about 0.35 μm to about 0.05 μm and after said processing to form said circuit features said photolithographic features have a minimum width of from about 0.35 μm to about 0.05 μm.

20. The process according to claim 12, wherein as formed said photolithographic features have a minimum width of from about 0% to about 5% of the minimum width of said photolithographic features after said processing to form said circuit features.

21. The process according to claim 12, wherein said photoresist is a chemically amplified photoresist.

22. The process according to claim 12, wherein said photoresist is selected from the group consisting of resists composed of photoacid generators and blocked polymer resins.

23. The process according to claim 12, wherein said photoresist is a chemically amplified photoresist.

24. The process according to claim 12, wherein said photoresist is selected from the group consisting of polyhydroxystyrene, blocked-polyhydroxystyrene, methacrylates and blocked methacrylates.

25. The process according to claim 12, wherein said photoresist is subjected to said at least one amine, said at least one amide, said at least one aldehyde, or said nitrogen for a time of from about 10 seconds to about 300 seconds.

26. The process according to claim 12, wherein said photoresist is exposed to said at least one amine, said at least one amide, said at least one aldehyde, or said nitrogen to a degree sufficient to reduce the amount of shrinkage that said photoresist experiences during processing that occurs after formation of said features in said photoresist.

* * * * *